(12) United States Patent
Zhu et al.

(10) Patent No.: US 12,471,473 B2
(45) Date of Patent: Nov. 11, 2025

(54) DISPLAY PANEL AND MANUFACTURING METHOD THEREFOR, AND DISPLAY DEVICE HAVING IMPROVED UTILIZATION OF LIGHT

(71) Applicants: Yunnan Invensight Optoelectronics Technology Co., Ltd., Yunnan (CN); BOE Technology Group Co., Ltd., Beijing (CN)

(72) Inventors: Zhijian Zhu, Beijing (CN); Pengcheng Lu, Beijing (CN); Chenyu Chen, Taiwan (CN); Yunlong Li, Beijing (CN); Dongsheng Li, Beijing (CN); Wei Liu, Beijing (CN); Longfei Fan, Beijing (CN); Qian Wu, Beijing (CN); Rongfei Chen, Beijing (CN); Yuanlan Tian, Beijing (CN); Dacheng Zhang, Beijing (CN)

(73) Assignees: YUNNAN INVENSIGHT OPTOELECTRONICS TECHNOLOGY CO., LTD., Yunnan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 527 days.

(21) Appl. No.: 17/915,228

(22) PCT Filed: Nov. 11, 2021

(86) PCT No.: PCT/CN2021/130149
§ 371 (c)(1),
(2) Date: Sep. 28, 2022

(87) PCT Pub. No.: WO2022/193691
PCT Pub. Date: Sep. 22, 2022

(65) Prior Publication Data
US 2023/0142473 A1    May 11, 2023

(30) Foreign Application Priority Data

Mar. 19, 2021 (CN) .......................... 202110298361.9

(51) Int. Cl.
*H10K 59/35* (2023.01)
*H10K 59/38* (2023.01)
(Continued)

(52) U.S. Cl.
CPC ......... *H10K 59/351* (2023.02); *H10K 59/353* (2023.02); *H10K 59/38* (2023.02); *H10K 59/879* (2023.02); *H10K 71/00* (2023.02)

(58) Field of Classification Search
CPC .... H10K 59/351; H10K 59/38; H10K 59/879; H10K 50/858; H10K 59/12
See application file for complete search history.

(56) References Cited

U.S. PATENT DOCUMENTS 7,187,425 B2   3/2007   Yamazaki
10,319,277 B2  6/2019   Wang et al.
(Continued)

FOREIGN PATENT DOCUMENTS

CN   1580881 A     2/2005
CN   202736924 U   2/2013
(Continued)

OTHER PUBLICATIONS

International Search Report and Written Opinion mailed on Jan. 26, 2022, in corresponding PCT/CN2021/130149, 6 pages.
(Continued)

*Primary Examiner* — Nduka E Ojeh
(74) *Attorney, Agent, or Firm* — XSENSUS LLP (57) ABSTRACT

A display panel includes a plurality of first pixel units, each of the first pixel units including a first sub-pixel, a second sub-pixel, a third sub-pixel and a fourth sub-pixel of differ-
(Continued)

ent colors, and the four sub-pixels including a white sub-pixel. In each of the first pixel units, the four sub-pixels are arranged in two rows and two columns, the first sub-pixel and the fourth sub-pixel are diagonally located and centrally symmetric, the second sub-pixel and the third sub-pixel are diagonally located and centrally symmetric, the first pixel unit composed of the four sub-pixels is formed in a hexagon as a whole, and the first pixel unit has at least two obtuse angles or two arc edges protruding toward a direction away from a center of the first pixel unit.

18 Claims, 5 Drawing Sheets

(51) Int. Cl.
*H10K 59/80* (2023.01)
*H10K 71/00* (2023.01)

(56) References Cited

U.S. PATENT DOCUMENTS

| | | | |
|---|---|---|---|
| 2005/0041188 A1* | 2/2005 | Yamazaki | G09G 3/3607 |
| | | | 349/146 |
| 2009/0302331 A1 | 12/2009 | Smith et al. | |
| 2015/0358593 A1 | 12/2015 | Sato | |
| 2017/0249889 A1 | 8/2017 | Wang et al. | |
| 2019/0035364 A1* | 1/2019 | Iwasaki | G09G 5/003 |
| 2019/0221176 A1* | 7/2019 | Emslie | G02F 1/13471 |
| 2022/0137268 A1* | 5/2022 | Yun | G02B 3/0006 |
| | | | 348/302 |

FOREIGN PATENT DOCUMENTS

| | | |
|---|---|---|
| CN | 104036700 A | 9/2014 |
| CN | 110235520 A | 9/2019 |
| CN | 111697037 A | 9/2020 |
| CN | 113053985 A | 6/2021 |
| IN | 110459577 A | 11/2019 |

OTHER PUBLICATIONS

Office Action issued on Jul. 5, 2022, in corresponding Chinese patent Application No. 202110298361.9, 31 pages.

Office Action issued on Mar. 10, 2023, in corresponding Chinese patent Application No. 202110298361.9, 22 pages.

\* cited by examiner

DISPLAY PANEL AND MANUFACTURING METHOD THEREFOR, AND DISPLAY DEVICE HAVING IMPROVED UTILIZATION OF LIGHT

CROSS REFERENCE TO RELATED APPLICATION

The present application is the U.S. national phase application of PCT Application No. PCT/CN2021/130149, filed Nov. 11, 2021, which claims priority to a Chinese patent application No. 202110298361.9, filed on Mar. 19, 2021 and entitled "DISPLAY PANEL AND MANUFACTURING METHOD THEREFOR, AND DISPLAY DEVICE,"the entire contents of each of which are incorporated herein by reference in their entirety.

TECHNICAL FIELD

The present disclosure relates to the field of display technology, and in particular, to a display panel and a manufacturing method thereof, and a display device.

BACKGROUND

Micro OLED display devices are characterized in excellent image quality, hill color spectrum, response time in microseconds, high resolution, color depth and low power consumption, and have a huge impact in variety of applications such as AR/VR equipment, military, industrial, medical and smart. classes.

The Micro OLED display devices are based on a monocrystalline silicon chip, with a pixel size being 1/10 of the traditional display device and fineness being much higher than the traditional device. The monocrystalline silicon chip adopts existing mature integrated circuit CMOS process, which not only realizes the active addressing matrix of the display screen pixels, but also realizes the driving control circuit of various functions such as SRAM memory and T-CON (timing controller) on the silicon chip. Accordingly the external wiring of the device is greatly reduced, the reliability is increased, and the weight is reduced.

However, this technology has its own shortcomings. At present, Micro OLED display devices generally have problems such as low luminous brightness, which limits their wide application in the field of AR/VR.

SUMMARY

The present disclosure is directed to overcome the above-mentioned shortcomings of the related art, and to provide a display panel and a manufacturing method thereof, and a display device.

According to an aspect of the disclosure, a display panel is provided, including a plurality of first pixel units, where each of the first pixel units includes a first sub-pixel, a second sub-pixel, a third sub-pixel and a fourth sub-pixel of different colors, and the four sub-pixels include a white sub-pixel;

in each of the first pixel units, the four sub-pixels are arranged in two rows and two columns, the first sub-pixel and the fourth sub-pixel are diagonally located and centrally symmetric, the second sub-pixel and the third sub-pixel are diagonally located and centrally, symmetric, the first pixel unit composed of the four sub-pixels is formed in a hexagon as a whole, and the first pixel unit has at least two obtuse angles or two arc edges protruding toward a direction away from a center of the first pixel unit.

In some embodiments of the disclosure, all sub-pixels in the plurality of first pixel units are arranged in an array along a row direction and a column direction; where, in (2m−1)-th row of sub-pixels, the first sub-pixels and the second sub-pixels are alternately arranged; in 2m-th row of sub-pixels, the third sub-pixels and the fourth sub-pixels are alternately arranged; in the (2m−1)-th row and 2m-th row of sub-pixels, the third sub-pixels and the first sub-pixels are located in a same column, and the fourth sub-pixels and the second sub-pixels are located in a same column, where m is a positive integer greater than or equal to 1; and one of the first pixel units is composed of one of the first sub-pixels and one of the second sub-pixels located in the (2m−1)-th row and one of the third sub-pixels and one of the fourth sub-pixels located in the 2m-th row.

In some embodiments of the disclosure, the first sub-pixel, the second sub-pixel, the third sub-pixel and the fourth sub-pixel are all right-angled trapezoids having a same shape and a same size, and the right-angled trapezoid has two right angles, one acute angle and one obtuse angle;

in the first pixel unit, one right angle of each sub-pixel is located in a center of the hexagon and is in contact with each other, the acute angles of two sub-pixels are in contact to form one angle of the hexagon, the acute angles of other two sub-pixels are in contact to form another angle of the hexagon, and the obtuse angles of the four sub-pixels form remaining four angles of the hexagon respectively.

In some embodiments of the disclosure, a first sub-pixel in the (2m−1)-th row and a third sub-pixel in (2m+1)-th row are located in a same column, a second sub-pixel in the (2m−1)-th row and a fourth sub-pixel in the (2m+1)-th row are located in a same column; a third sub-pixel and a fourth sub-pixel in the 2m-th row and a first sub-pixel and a second sub-pixel in the (2m+1)-th row form a second pixel unit, and a shape of the second pixel unit is a rectangle;

in the second pixel unit, the acute angles of two sub-pixels and the obtuse angles of other two sub-pixels are located in a center of the rectangle and are in contact with each other, and the right: angles of four sub-pixels are located at outer periphery and separated from each other, forming four angles of the rectangular respectively.

In some embodiments of the disclosure, in the first pixel unit, an acute angle of the first sub-pixel and an acute angle of the second sub-pixel are in contact to form one angle of the hexagon, an acute angle of the third sub-pixel and an acute angle of the fourth sub-pixel are in contact to form another angle of the hexagon, and the obtuse angles of the four sub-pixels form remaining four angles of the hexagon respectively.

In some embodiments of the disclosure, the acute angle of the right-angled trapezoid is 60°, and the obtuse angle is 120°.

In some embodiments of the disclosure, the hexagon is a regular hexagon, and die rectangle is a square.

In some embodiments of the disclosure, the first sub-pixel is a red sub-pixel, the second sub-pixel is a green sub-pixel, the third sub-pixel is a blue sub-pixel, and the fourth sub-pixel is a white sub-pixel.

In sortie embodiments of the disclosure, the display panel further includes a microlens layer, including a plurality of lenses, where each of the lenses is provided corresponding to one of the first pixel units, and is used for converging outgoing light of the sub-pixels.

In some embodiments of the disclosure, the display panel further includes:
a driving backplane;
a light-emitting layer provided on one side of the driving backplane including a white light-emitting layer corresponding to each sub-pixel;
a filter layer provided on one side of the light-emitting layer away from the driving backplane, including a first filter layer corresponding to the first sub-pixel, a second filter layer corresponding, to the second sub-pixel, a third filter layer corresponding to the third sub-pixel, so that the first sub-pixel displays a first color, the second sub-pixel displays a second color, the third sub-pixel displays a third color, and the fourth sub-pixel displays white; and
a first planarization layer, provided on one side of the filter layer away from the driving backplane;
where the microlens layer is located between the filter layer and the fist planarization layer; the lens is as convex lens, and a refractive index of the convex lens is greater than a refractive index of the first planarization layer; or the lens is a concave lens, and a refractive index of the concave lens is smaller than a refractive index of the first planarization layer.

In some embodiments of the disclosure, the display panel further includes a second planarization layer provided between the microlens layer and the filter layer, where a refractive index of the lens is greater than a refractive index of the second planarization layer.

In some embodiments of the disclosure, the display panel further includes a support layer provided between the second planarization layer and the light-emitting layer of the fourth scab pixel, where the support layer is a transparent film layer.

In some embodiments of the disclosure, a thickness of the support layer is equal to a thickness of the filter layer.

In some embodiments of the disclosure, a material of the support layer is same as a material of the lens.

In some embodiments of the disclosure, a projection of the lens on the driving backplane is located within a projection of the first pixel unit corresponding to the lens, and is circular.

According to another aspect of the disclosure, a method for manufacturing a display panel in provided, including forming a plurality of first pixel units, where each of the first pixel units includes a first sub-pixel, a second sub-pixel, a third sub-pixel and a fourth sub-pixel of different colors, and the four sub-pixels include a white sub-pixel; and
when forming the first pixel units, the four sub-pixels in each of the first pixel units are arranged in two rows and two columns, the first sub-pixel and the fourth sub-pixel are diagonally located and centrally symmetric, the second sub-pixel and the third sub-pixel are diagonally located and centrally symmetric, the first pixel unit composed of the four sub-pixels is formed in a hexagon as a whole, and the first pixel unit has at least two obtuse angles or two arc edges protruding toward a direction away from a center of the first pixel unit.

In some embodiments of the disclosure, forming the first pixel unit includes:
providing a driving backplane;
forming a light-emitting layer on one side of the driving backplane, where the light-emitting layer includes a white light-emitting layer corresponding to each sub-pixel,
forming a filter layer on one side of the light-emitting layer away from the driving backplane, and forming the filter layer includes forming a first filter layer corresponding to the first sub-pixel, forming a second filter layer corresponding to the second sub-pixel, and forming a third filter layer corresponding to the third sub-pixel;
forming a planarization layer on one side of the filter layer away from the light-emitting layer; and
forming a microlens layer on one side of the planarization layer away from the filter layer where the microlens layer includes a plurality of lenses, each of the lenses is provided corresponding to one of the first pixel units, and is used for converging outgoing light of the sub-pixels.

In some embodiments of the disclosure, the method further includes:
forming a support layer on one side of the light-emitting layer of the fourth sub-pixel away from the driving backplane, where the support layer is a transparent film layer; and
the planarization layer is formed on one side of the filter layer and the support layer away from the driving backplane.

According to still another aspect of the disclosure, a display device is provided, including the display panel as described above.

It is to be understood that the foregoing general description and the following detailed description are exemplary and explanatory only and are not restrictive of the present disclosure.

BRIEF DESCRIPTION OF THE DRAWINGS

The accompanying drawings, which are incorporated in and constitute a pan of this specification, illustrate embodiments consistent with the disclosure and together with the description serve to explain the principles of the disclosure. Obviously, the drawings in the following description are only some embodiments of the present disclosure, and for those of ordinary skill in the art, other drawings can also be obtained from these drawings without creative effort.

FIG, 2 is a partial cross-sectional view of the display panel in FIG. 1.

Description of reference numbers are given as follows.

1, Monocrystalline silicon driving backplane; 2, light-emitting layer; 3, filter layer; 31, first filter layer; 32, second filter layer; 33, third filter layer; 4, lens; 5, first planarization layer; 6, second planarization layer; 7, third planarization layer; 8, support layer;

10, first sub-pixel; 20, second sub-pixel; 30, third sub-pixel; 40, fourth sub pixel; 901, first pixel unit; 902, second pixel unit.

DETAILED DESCRIPTION

Exemplary embodiments will now be described more fully with reference to the accompanying drawings. Exemplary embodiments, however, can be embodied in various forms arid should not be construed as limited to the embodiments set forth herein. Instead, these embodiments are provided so that this disclosure will be thorough and complete, and will fully convey the concept of exemplary embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "on/above"and "under/below"are used in this specification to describe the relative relationship of one component as illustrated to another component, these terms are used in this specification only for convenience, such as according to the direction of the example as described. It should be understood that if the device as illustrated is turned upside down, the components described as "on/above" will become the components as "under/below". When a certain structure is "on/above"another structure, it may mean that the certain structure is integrally formed on the another structure, or that the certain structure is "directly"provided on the another structure, or that the certain structure is "indirectly"provided on the another structure through still another structure.

The terms "a", "an", "the", "said" and "at least one"are used to indicate the presence of one or more elements/components/and the like; the terms "include" and "have" are used to indicate an open-ended inclusion and. means that additional elements/components/and the like may be present in addition to the elements/components/and the like as listed. The terms "first", "second", "third"and the like are only used as a marker, without limiting the number of related objects.

The present disclosure takes a Micro OLED display panel as an example for description. Existing Micro OLEDs use white OLEDs and color filters to form a full-color infrastructure. The inventor found that another reason for the low luminous brightness of the existing Micro OLED display panel is that the color filter realizes the transmission of "monochromatic light"by absorbing light of a specific wavelength, so the white light emitted by the OLED device may have its brightness dropping sharply after passing through the color filter (CF). At present, only ¼ of the white light emitted by OLED devices is effectively utilized. In order to improve the utilization rate of light, the inventor believes that the pixel unit may be made in the form of RGBW, and the light transmittance can be improved by adding white (W) sub-pixels. But at the same time, the inventor found that, under the premise of a fixed pixel size, adding one sub-pixel will inevitably lead to a decrease in the aperture ratio of the other three (RGB) sub-pixels, thereby limiting the improvement of light transmittance. Moreover, the inventor found that another reason for the low luminance of the Micro OLED display panel is that a planarization layer is arranged above the color filter, so that the panel can be flatly aligned with the cover plate, and part of the light emitted from the sub-pixels cannot pass through due to total reflection occurring in the planarization layer, thereby further affecting the light utilization rate.

In order to improve the utilization of light, the inventor believes that a lens may be prepared on the fight-emitting side of the pixel unit, so that the lens can be used to converge the emitted light of the sub-pixels, so as to alleviate the problem of low utilization of light caused by the reduction of the aperture ratio, and improve the brightness of the display panel. At the same time, the presence of lens can destroy the condition of total reflection of the outgoing light, thereby improving the light transmittance, and finally improving the brightness of the panel. However, the microlenses applied to the Micro OLED display panel are typically regular spheres or ellipsoids, which cannot be made into other shapes. Therefore, the premise of preparing the lens is to provide a reasonable pixel structure.

In view of above, in the present disclosure, the first pixel unit in the Micro OLED display panel is provided in a symmetrical hexagonal structure, which is conducive to preparing a lens with regular shape thereon.

Figure 1:
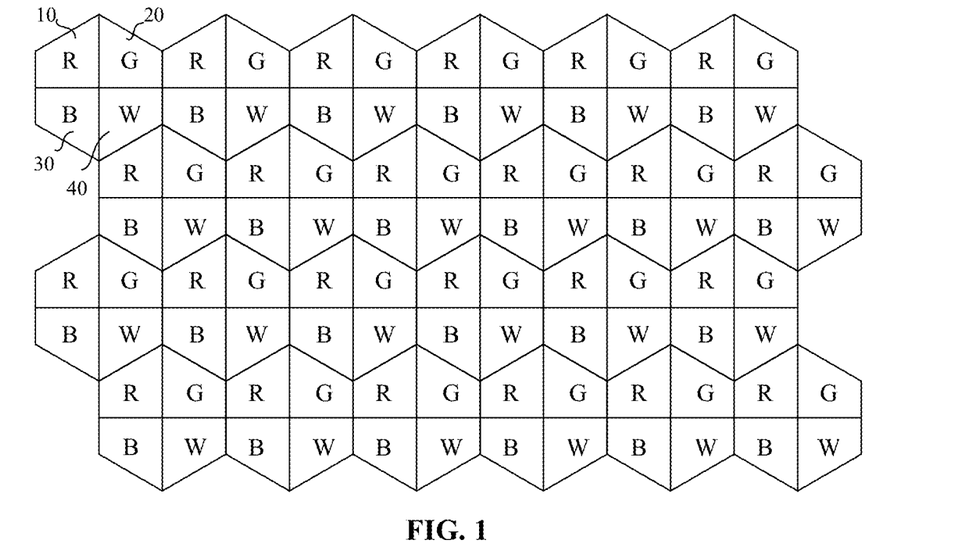
FIG. 1 is a top view of a display panel according to some embodiments of the disclosure.
Figure 2:
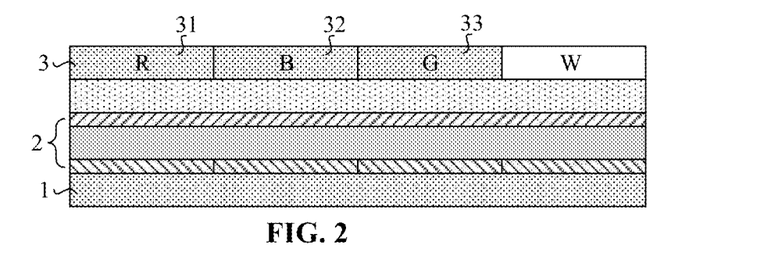

Referring to FIG. 1 and FIG. 2, FIG. 1 is a schematic diagram of pixel arrangement of a Micro OLED display panel according to some embodiments of the disclosure, and FIG. 2 is a partial cross-sectional view of the display panel. The display panel includes a plurality of first pixel units 901, each first pixel unit 901 includes a first sub-pixel 10, a second sub-pixel 20, a third sub-pixel 30 and a fourth sub-pixel 40 of different colors, A white sub-pixel is included in the four sub-pixels. In each first pixel unit 901, four sub-pixels are arranged in two rows and two columns, the first sub-pixel 10 and the fourth sub-pixel 40 are diagonally located and centrally symmetric, the second sub-pixel 20 and the third sub-pixel 30 are diagonally located and centrally symmetric, the first pixel unit 901 composed of four sub-pixels is formed in a hexagon as a whole, and has at least two obtuse angles or two arc edges protruding toward a direction away from a center of the first pixel unit 901.

The Micro OLED display panel of the present disclosure includes white Rib-pixels. Since a filter layer does not need to be provided above the white sub-pixels, the white light emitted by the white light-emitting layer can be 100% emitted. Compared to those sub-pixels provided with the filter layer 3, the transmittance of the white sub-pixels is higher. Accordingly, when the first sub-pixel 10, the second sub-pixel 20, the third sub-pixel 30 and the fourth sub-pixel 40 (white sub-pixel) form a pixel unit, due to the existence of the white sub-pixel, the light-emitting rate of the entire pixel unit can be improved, thereby improving the brightness of the display panel. It has been verified by experiments that the light output rate of the display panel using RGBW pixel units can be increased by 1.5 times compared with the light output rate of the display panel using RGB pixel units.

For example, the first sub-pixel 10 to the third sub-pixel 30 may be respectively a red sub-pixel, a green sub-pixel, and a blue sub-pixel, that is, the first filter layer 31 to the third filter layer 33 may be respectively a red filter layer, a green filter layer, and a blue filter layer. Four sub-pixels form an RGBW pixel unit to achieve full-color display. As mentioned above, for the pixel structure of the present disclosure, it is necessary to provide a suitable pixel arrangement, so as to provide the lens thereon.

In the following, examples will be described in which the first sub-pixel 10 is a red sub-pixel (R), the second sub-pixel 20 is a green sub-pixel (G), the third sub-pixel 30 is a blue sub-pixel (B), and the fourth sub-pixel 40 is a white sub-pixel.

Referring to FIG. 1, in some embodiments, all the sub-pixels of the first pixel units 901 are arranged in an array along the row direction and the column direction. In some embodiments, in the (2m−1)-th row of sub-pixels, the first sub-pixels 10 and the second sub-pixels 20 are alternately arranged; in the 2m-th row of sub-pixels, the third sub-pixels 30 and the fourth sub-pixels 40 are alternately arranged; in the (2m−1)-th row and 2m-th row of sub-pixels, the third sub-pixels 30 and the first sub-pixels 10 are located in the same column, and the fourth sub-pixels 40 and the second sub-pixels 20 are located in the same column, where m is a positive integer greater than or equal to 1. The first sob pixel and the second sub-pixel located in the (2m−1)-th row and the third sub-pixel and the fourth sub-pixel located in the 2m-th row form a first pixel unit.

Figure 3:
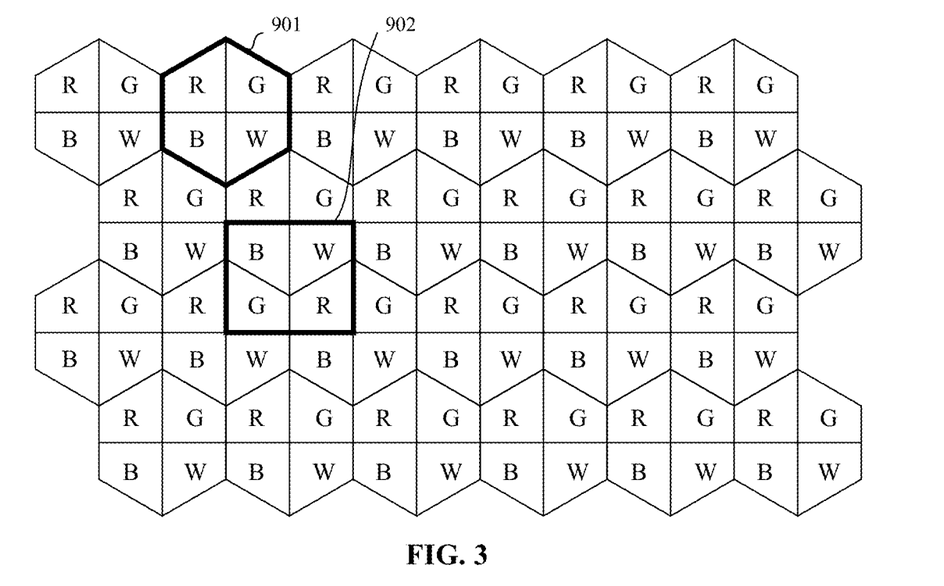
FIG. 3 is a schematic diagram of a first pixel unit and a third pixel unit in FIG. 1.

Referring to FIG. 1 to FIG. 4, in odd-numbered rows, red sub-pixels and green sub-pixels are alternately arranged; and in even-numbered rows, blue sub-pixels and white sub-pixels are alternately arranged. In two adjacent rows, the red sub-pixels and the blue sub-pixels are located in the same column, and the green sub-pixels and the white sub pixels are located in the same column.

in some embodiments, the red sub-pixels and the green sub-pixels located in the (2m−1)-th row and the blue sub-pixels and the white sub-pixels located in the 2m-th row may constitute the first pixel unit 901. For example, as shown in FIG. 3, the third and fourth sub-pixels in the first row are red sub-pixel and green sub-pixel, respectively, and the third and fourth sub-pixels in the second row are blue sub-pixel and white sub-pixel, respectively. These four sub-pixels are RGBW in clockwise order, forming the smallest repeating unit. In some other embodiment, referring to FIG. 4, the fourth and fifth sub-pixels in the first row are green sub-pixel and red sub-pixel, respectively, and the fourth and fifth sub-pixels in the second row are white sub-pixel and blue sub-pixel, respectively. These four sub-pixels may also form the first pixel unit 901, and the sub-pixels in the pixel unit are GRWB in the clockwise direction, also forming the smallest repeating unit.

Figure 7:
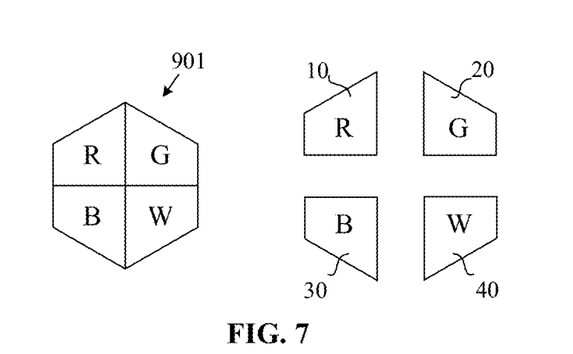
FIG. 7 is a schematic diagram of the first pixel unit and each sub-pixel in FIG. 3.
Figure 8:
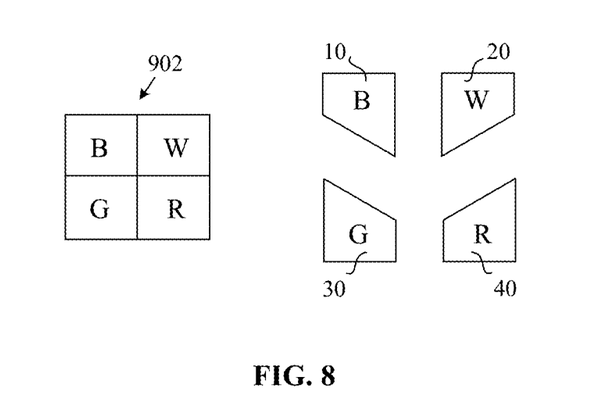
FIG. 8 is a schematic diagram of the second pixel unit and each sub-pixel in FIG. 4.

In some embodiments, referring to FIG. 7 and FIG. 8, the first sub-pixel 10, the second sub-pixel 20, the third sub-pixel 30 and the fourth sub-pixel 40 in the first pixel unit 901 are all right-angled trapezoids having a same shape and, a same size, and the right-angled trapezoid includes two right angles, one acute angle and one obtuse angle. In the first pixel unit 901, four sub-pixels are arranged symmetrically, and the right angle of each sub-pixel is located in the center of the hexagon and is in contact with each other. The acute angles of two sub-pixels are in contact to form one angle of the hexagon, the acute angles of other two sub-pixels are in contact to form another angle of the hexagon, and the obtuse angles of the four sub-pixels form remaining four angles of the hexagon respectively.

On the basis that the first pixel unit is composed of four right-angled trapezoids, four right-angled trapezoids may further form a plurality of second pixel units. Referring to FIG. 1, a first sub-pixel in the (2m−1)-th row and. a third sub-pixel in (2m+1)-th row are located in the same column, a second sub-pixel in the (2m−1)-th row and a fourth sub-pixel in the (2m+1)-th row are located in the same column; a third sub-pixel and a fourth sub-pixel in the 2m-th row and a first sub-pixel and a second sub-pixel in the (2m+1)-th row form a second pixel unit 902, and a shape of the second pixel unit 902 is a rectangle. In the second pixel unit 902, the acute angles of two sub-pixels and the obtuse angles of other two sub-pixels are located in a center of the rectangle and are in contact with each other, and the right angles of four sub-pixels are located at outer periphery and separated from each other, forming four angles of the rectangular respectively. According to the above arrangement, the four right-angled trapezoids forming the first pixel unit may also form a rectangular pixel unit. Since the second pixel unit 902 is composed of four right-angled trapezoids that are symmetrical in pairs, based on the above arrangement, the first sub-pixel 10 and the second sub-pixel 20 in the second pixel unit 902 have an axisymmetric structure in the column direction, and the third sub-pixel 30 and the fourth sub-pixel 40 also have an axisymmetric structure in the column direction.

Specifically, referring to FIG. 1, in two adjacent odd-numbered rows, the red sub-pixels in one odd-numbered row and the green sub-pixels in the other odd-numbered row are located in the same column, that is, the sub-pixels in the two odd-numbered rows are staggered. In two adjacent even-numbered rows, the blue sub-pixels in one even-numbered row and the white sub-pixels in the other even-numbered row are located in the same column, that is, the sub-pixels in the two even-numbered rows are staggered. As shown in the drawings, in a column of sub-pixels, red sub-pixels, blue sub-pixels, green sub-pixels and white sub-pixels are arranged in sequence.

In some embodiments, referring to FIG. 3, the blue sub-pixel and the white sub-pixel in the 2m-th row and the red sub-pixel and the green sub-pixel in the (2m+1)-th row constitute a second pixel unit 902. For example, as shown in the drawings, the third and fourth sub-pixels in the fourth row are blue and white sub-pixels, respectively, and the third and fourth sub-pixels in the fifth row are red and green sub-pixels, respectively. These four sub-pixels are BWRG in turn in a clockwise direction, forming the smallest repeating unit.

Figure 4:
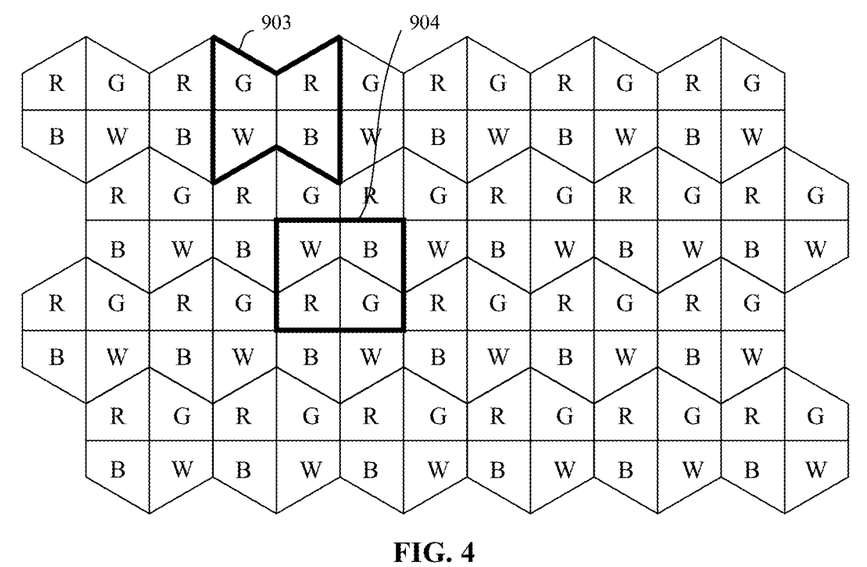
FIG. 4 is a schematic diagram of a second pixel unit and a fourth pixel unit in FIG. 1.

In some embodiments, referring to FIG. 4, the fourth and fifth sub-pixels in the fourth row are white and blue sub-pixels, respectively, and the fourth and fifth sub-pixels in the fifth row are green and red sub-pixels, respectively. These four sub-pixels form a second pixel unit 902, and the sub-pixels in this pixel unit are WBGR in a clockwise direction, and may also form the smallest repeating unit.

Therefore, in some embodiments of the present disclosure, every adjacent four sub-pixels tin the form of 2×2) can form a smallest repeating unit, which is regarded as a pixel unit.

Referring to FIG. 3 and FIG. 4, the above four types of pixel units may be formed in the display panel, and any type of pixel units may be selected for display when displaying a picture. Accordingly, a corresponding pixel driving circuit may need to be provided on the driving backplane.

Figure 5:
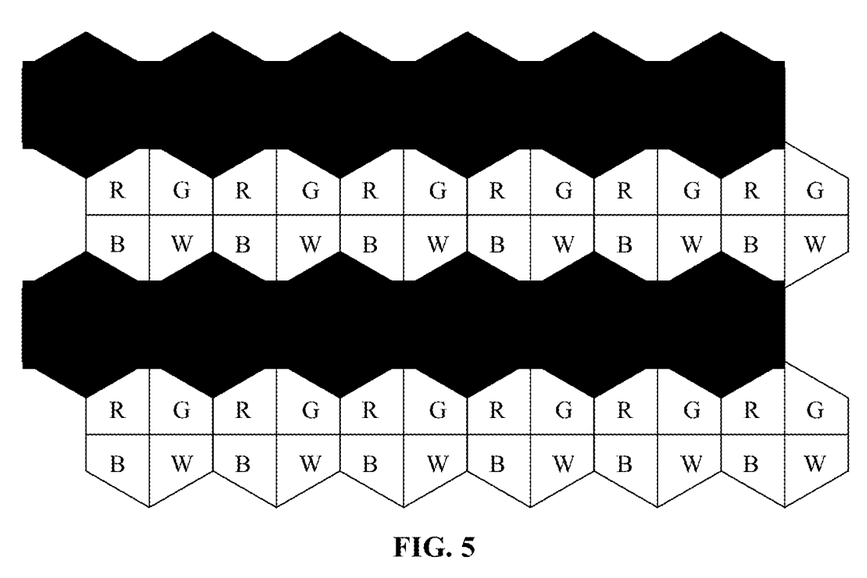
FIG. 5 is a schematic diagram of the display panel in FIG. 1 displaying horizontal white lines or black lines.
Figure 6:
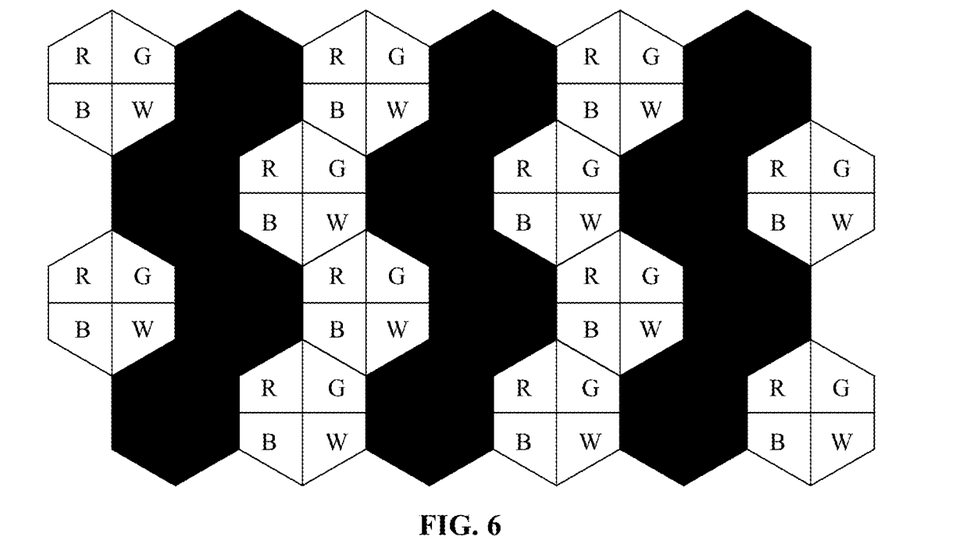
FIG. 6 is a schematic diagram of the display panel in FIG. I displaying vertical white lines or black lines.

When the above-mentioned display panel displays a white line, all the pixels in a row are correspondingly turned on, and when the display panel displays a black line, all the pixels in a row are correspondingly turned off. Monochromatic color lines can also be achieved in the same way. Taking the structure of the first pixel unit 901 shown in FIG. 3 as an example, referring to FIG. 5, the sub-pixels in the first row and the second row form a pixel row, when all the sub-pixels in the pixel row are turned off, the pixel row is displayed as a black line. The third and fourth rows of sub-pixels form another pixel row, when all sub-pixels of this pixel row are turned on, this pixel row is displayed as a white line. Referring to FIG. 6, the sub-pixels in the third and fourth columns of odd-numbered rows, and the sub-pixels in the first and second columns of even-numbered rows form a pixel column, when all sub-pixels in this pixel column are turned off, the pixel column is displayed as a black line. The sub-pixels in the fifth and sixth columns of odd-numbered rows and the sub-pixels in the third and fourth columns of even-numbered rows form a pixel column, when all sub-pixels in this pixel column are all turned on, the pixel column is displayed as a white line.

In the embodiments shown in FIG. 3 and FIG. 4, the first pixel unit 901 has two straight sides arranged oppositely in the row direction, and two angles oppositely arranged in the column direction. In other words, the acute angle of the first sub-pixel 10 and the acute angle of the second sub-pixel 20 are in contact to form the first angle of the hexagon the acute angle of the third sub-pixel 30 and the acute angle of the fourth sub-pixel 40 are in contact to form the second angle of the hexagon; the first angle and the second angle are arranged opposite to each other in the column direction, the obtuse angles of the four sub-pixels form the remaining four angles of the hexagon, respectively; and the left and right straight sides are arranged oppositely in the column direction, In some other embodiments, the shape of the first pixel unit 901 may be rotated 900 clockwise. In other words, the acute angle of the first sub-pixel 10 and the acute angle of the third sub-pixel 30 are in contact to form the first angle of the hexagon, and the acute angle of the second sub-pixel 20 and the acute angle of the fourth sub-pixel 40 are in contact to form the second angle of the hexagon. The first angle and the second angle are arranged opposite to each other in the row direction, the obtuse angles of the four sub-pixels form the remaining four angles of the hexagon, respectively; and the upper and lower straight sides are arranged oppositely in the column direction.

Figure 9:
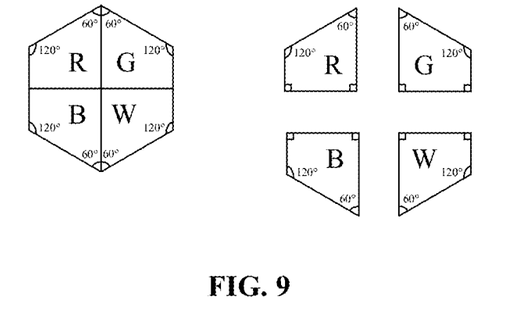
FIG. 9 is a schematic diagram of each angle in the first pixel unit and the second pixel unit.

No matter which shape the first pixel unit 901 adopts, the second pixel unit 902 can be formed in the rectangle. In some embodiments, referring to FIG. 9, the acute angle of the right-angled trapezoid is 60°, the obtuse angle is 120°, and the other two are right angles. The first pixel unit 901 and the second pixel unit 902 thus formed are symmetrical and regular shapes. The number of sub-pixels in the display panel according to the disclosure is equal to "the resolution in the horizontal direction×2×2×the resolution in the vertical direction". The pixel structure of the shape and arrangement determines that the RGBW pixel arrangement of the present disclosure is a Real RGBW arrangement, and the number of sub-pixels is equal to "the resolution in the horizontal direction×2×2×the resolution in the vertical direction".

The film layer structure of the above-mentioned display panel will be described below. Referring to the FIG. 11, the display panel includes a monocrystalline silicon driving backplane 1. The monocrystalline silicon driving backplane 1 uses monocrystalline silicon as an active driving substrate, on which a driving circuit for driving pixels to emit light is formed by processes such as integrated circuit CMOS.

Figure 10:
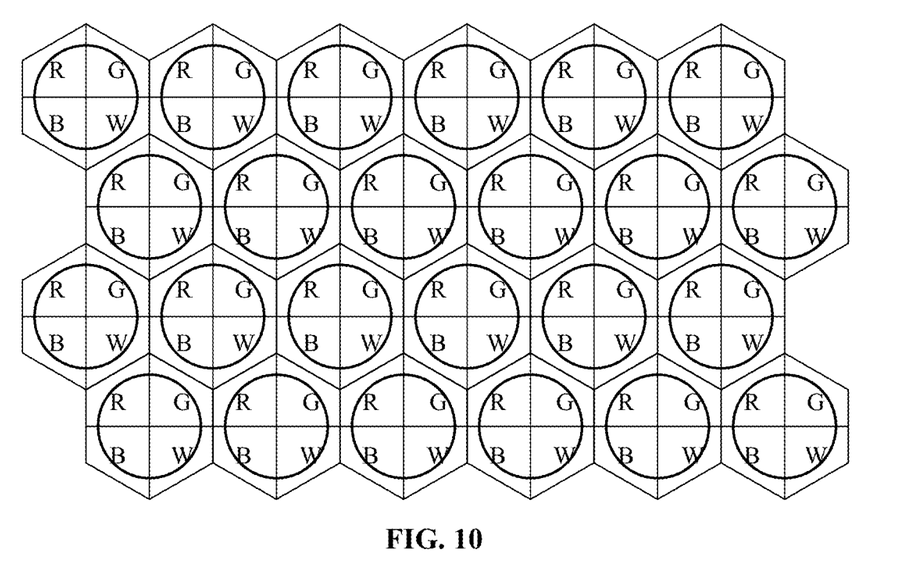
FIG. 10 is a top view of a display panel including a microlens layer according to some embodiments of the disclosure.
Figure 11:
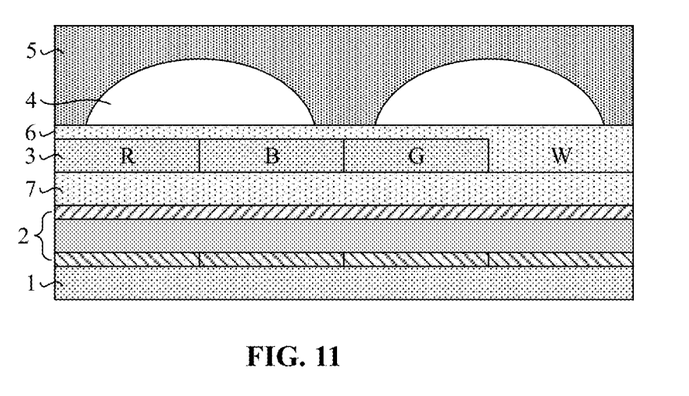
FIG. 11 is a cross-sectional view of an ideal form of the microlens layer in FIG. 10.

A light-emitting layer 2 is provided on one side of the monocrystalline silicon driving backplane 1, and the light-emitting layer 2 includes a White light-emitting layer corresponding to each sub-pixel. A filter layer 3 is provided on one side of the light-emitting layer 2 away from the monocrystalline silicon driving backplane 1, and the filter layer 3 includes a first filter layer 31 corresponding to the first sub-pixel 10, a second filter layer 32 corresponding to the second sub-pixel 20, a third filter layer 33 corresponding to the third sub-pixel 30, so that the first sub-pixel 10 displays the first color, the second sub-pixel 20 displays the second color, and the third sub-pixel 30 displays the third color. The fourth sub-pixel 40 directly displays white color without providing the filter layer 3. In other words, the Micro OLED display panel of the present disclosure is fabricated by using, white light OLED combined with color filters to RGBW pixel units. The display panel further includes a microlens layer, the microlens layer is arranged on one side of the filter layer 3 away from the light-emitting layer 2, and includes a plurality of lenses 4. The lenses 4 are arranged on the light-emitting side of the sub-pixels for converging the outgoing light of the sub-pixels. Referring to FIG. 10 and FIG. 11. FIG. 10 is a top view of a display panel including a microlens layer, and FIG. 11 is a partial cross-sectional view of the display panel including a microlens layer.

Each lens 4 may correspond to one sub-pixel, or may correspond to one pixel unit. In some embodiments of the present disclosure, since the pixel unit includes four sub-pixels, the size of each sub-pixel is small without changing the pixel size. Due to the high pixel density of silicon-based OLEDs, it is basically difficult for human eyes to distinguish between pixels and sub-pixels. Therefore, in some embodiments of the present disclosure, the lens 4 is correspondingly provided on the light-emitting side of the first pixel unit 901 or the second pixel unit 902. Accordingly, the projection of the lens 4 on the monocrystalline silicon driving backplane 1 should be located within the first pixel unit 901 or the second pixel unit 902, and the larger the area covered. by the lens 4, the more light is converged, and the more the brightness is improved.

When the microlens layer is formed on the display panel shown in FIG. 10, the first pixel unit 901 and the second pixel unit 902 are hexagonal and rectangular, respectively, and relatively regular lens 4 are easily formed in the regular-shaped hexagonal or rectangular pixel units, thereby being convenient for converging the divergent light of the pixel units through the lens 4. Further, the hexagon of the first pixel unit 901 is preferably a regular hexagon, and the rectangle of the second pixel unit 902 is preferably a square, so that circular lenses 4 may be formed in the area of the regular hexagon or the square, thereby uniformly converging the outgoing light from all angles of the pixel unit. In some embodiments, the lens 4 is a circular lens. In other words, when the projection of the lens 4 on the monocrystalline silicon driving backplane 1 is an inscribed circle of a regular hexagon or a square, the light-converging effect is the highest. At the same time, when the material of the lens 4 is heated and baked, the shape of the lens 4 with better light-converging effect can be formed, and the height adjustment degree of the lens 4 is relatively large. In the present disclosure, the circular lens 4 is preferably formed in the regular hexagonal shape of the first pixel unit 901, so that the lens with the largest area can be formed, and the light-converging effect can be improved to the greatest extent.

it has been verified by experiments that after the lens 4 is provided on the basis of the structure of the RGBW pixel units, the light output rate of the display panel can be increased by 1.6 times compared with that without the lens. In other words, When the structure of RGBW pixel units of the present disclosure is used in combination with the lens, the light output rate can be increased by 2.4 (=1.5×1.6) times compared with the display panel with the RUB pixel unit and without the lens, thereby greatly improving the brightness of the display panel.

As shown in the drawing, a first planarization layer 5 is further formed above the microlens layer. The first planarization layer 5 is used to protect the lens 4 and is in contact with an upper cover plate (not shown in the drawing) to improve the bonding effect. The first planarization layer 5 may be made of materials such as silicon oxide.

Figure 12:
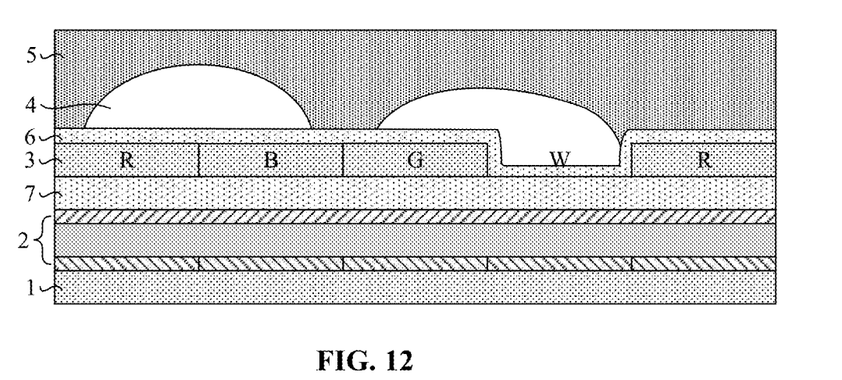
FIG 12 is a cross-sectional view of an actual form of the microlens layer in FIG. 10.
Figure 13:
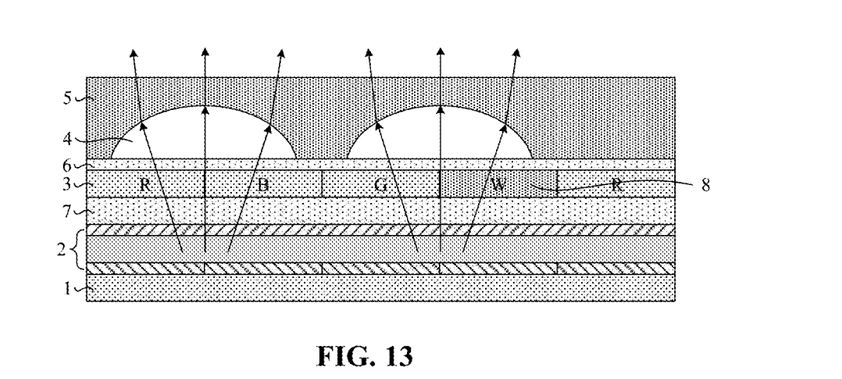
FIG. 13 is a cross-sectional view of a display panel according to some other embodiments of the disclosure.

In some embodiments, referring to FIG. 11 to FIG. 13, the display panel further includes a second planarization layer 6 provided between the filter layer 3 and the microlens layer. In some embodiments, a third planarization layer 7 may be further provided between the light-emitting layer 2 and the filter layer 3. As shown in FIG. 13, in some embodiments, the lens 4 is a convex lens 4, and the refractive index of the convex lens is greater than that of the first planarization layer 5 provided thereon, so that the light emitted by the lens 4 can be converged. The dotted lines with arrows in the drawing represent the light paths of the light. Due to the change of the refractive index, the outwardly diffused light is converged after passing through the lens 4. On the other hand, compared to the structure without the lens 4 (the second planarization layer 6 and the first planarization layer a are in direct contact), the addition of the lens 4 reduces the probability of total reflection of light between the second planarization layer 6 and the first planarization layer 5. In order to achieve a desirable focusing effect, the refractive index of the lens 4 is also greater than the refractive index of the second planarization layer 6 below, thereby increasing the critical angle of total reflection of light at the interface between the second planarization layer 6 and the lens 4, reducing the probability of total reflection, and further improving the utilization of light. In some other embodiments, contrary to FIG. 11 to FIG. 13, the lens 4 may be a concave lens, and the refractive index of the lens 4 is smaller than the refractive index of the first planarization layer 5 provided thereon, so as to converge the light. Similarly, the refraction index of the lens 4 is also greater than the refraction index of the second planarization layer 6 below, thereby reducing the probability of total reflection of light at the interface between the second planarization layer 6 and the lens 4.

FIG. 11 illustrates a cross-sectional view of a form of the lens under ideal conditions. In the silicon-based OLED display of the present disclosure, in consideration of characteristics such as high temperature resistance and adhesion, the second planarization layer 6 is generally prepared by materials such as CT adhesive (conductive epoxy adhesive). However, the thickness of this type of planarization layer material is relatively thin (about 0.2 um), which is much smaller than the thickness of the filter layer 3 (about 1 um), and an uneven second planarization layer 6 will be formed. Referring to FIG. 12, the second planarization layer 6. It is difficult for the fourth sub-pixel 40 (white sub-pixel) with a pixel width of about 1 um to play a flattening effect. As shown in FIG. 12, if the microlens layer is fabricated on this uneven second planarization layer, the shape of the lens 4 on the white sub-pixel may be deformed or cannot be controlled, so that it cannot function as a light concentrator.

In view of above, in some embodiments, referring to FIG. 13, the display panel of the present disclosure further includes a support layer 8, and the support layer 8 is provided between the light-emitting layer 2 of the fourth sub-pixel 40 and the second planarization layer 6. In the structure as shown in FIG. 13, due to the presence of the third planarization layer 7, the support layer 8 is provided between the second planarization layer 6 and the third planarization layer 7 in a region of the white sub-pixel. The support layer 8 is used to fill the top of the white sub-pixel with the filter layer 3 to ensure that the second planarization layer 6 above can provide a flat support for the preparation of the microlens layer, and ensure the form of the lens 4. In some embodiments, the support layer 8 is a transparent film layer, so as not to affect the light emission of the white light-emitting layer. The support layer 8 may be any transparent organic film layer, and is preferably made of the same material as the lens 4, thereby reducing the costs of material and processing. In some embodiments, the thickness of the support layer 8 Is equal to the thickness of the filter layer 3 to facilitate subsequent planarization.

Embodiments of the present disclosure also provide a method for manufacturing the above-mentioned display panel, including a following step.

A plurality of first pixel units 901 are formed, and each first pixel unit 901 includes a first sub-pixel 10, a second sub-pixel 20, a third sub-pixel 30 and a fourth sub-pixel 40 of different colors; and the four sub-pixels include a white sub-pixel.

Herein, when the first pixel unit 901 is formed, the four sub-pixels in each first pixel unit 901 are arranged in two rows and two columns, the first sub-pixel 10 and the fourth sub-pixel 40 are diagonally located and centrally symmetric, the second sub-pixel 20 and the third sub-pixel 30 are diagonally located and centrally symmetric, the first pixel unit 901 composed of the four sub-pixels is formed in a hexagon as a whole, and has at least two obtuse angles or two arc edges protruding toward a direction away from a center of the first pixel unit 901.

Specifically, the method for forming the above-mentioned first pixel unit 901 further includes following steps.

In step S100, a monocrystalline silicon driving backplane 1 is provided.

Specifically, a silicon substrate (silicon wafer) is used as a substrate, and finer TFTs and wirings are formed by existing semiconductor process technologies. For example, TFTs on the order of several micrometers may be formed.

In step S200, a light-emitting layer 2 is formed on one side of the monocrystalline silicon driving backplane 1, and the light-emitting layer 2 includes a white light-emitting layer corresponding to each sub-pixel.

The light-emitting layer 2 may at least include an anode, a hole transport layer, a white light organic light-emitting layer, an electron transport layer and a cathode that are stacked in sequence, and may further include functional film layers such as a hole injection layer, an electron injection layer, a hole blocking layer, and an electron blocking layer. The anode may be prepared on the monocrystalline silicon driving, backplane 1 by processes such as metal sputtering deposition. Each light-emitting functional layer and cathode may adopt the whole surface evaporation process. In this step, an insulating structure may also be formed within the spacing between each sub-pixel to prevent, adjacent sub-pixels from cross-coloring each other. In addition, the third planarization layer 7 is formed by applying adhesive on the light-emitting layer 2, which is convenient for the subsequent processing.

In step S300, the filter layer 3 is formed on one side of the light-emitting layer 2 away from the monocrystalline silicon driving backplane 1, and forming the filter layer 3 includes forming a first filter layer 31 corresponding to the first sub-pixel 10, forming a second filter layer 32 corresponding to the second sub-pixel 20, and forming a third filter layer 33 corresponding to the third sub-pixel 30.

In this step, the filter layers 3 in the first to third sub-pixels 30 may be prepared by processes such as low-temperature yellow light, so as to form a red filter layer, a green filter layer, and a blue filter layer, where the filter layer 3 is not deposited above the white sub-pixels.

In step S400, the second planarization layer 6 is formed on one side of the filter layer 3 away from the light-emitting layer 2 by processes such as deposition. The second planarization layer 6 is made of CT adhesive (conductive epoxy adhesive) and the like.

In step S600, the microlens layer is formed. on one side of the planarization layer away from the filter layer 3.

When forming the microlens layer, a layer of lens material may be deposited on the second planarization layer 6 first, then a plurality of lenses 4 arranged in an array may be fumed through a patterning process (such as exposure and development), and they are finally baked to be harden and form the convex lenses as shown in the drawings. In some other embodiments, concave lenses may also be formed. The lens 4 may also be prepared by a process such as low temperature yellow light. Further, above the microlens layer, a material such as silicon oxide may be used to form the first planarization layer 5, which plays the role of protecting the lens.

In some embodiments, in order to ensure that the microlens layer prepared subsequently has an ideal form, the above preparation method may further include step S500.

In step S500, a support layer 8 is formed on one side of the light-emitting layer 2 of the fourth sub-pixel away from the monocrystalline silicon driving backplane, and the support layer 8 is a transparent film layer.

The support layer 8 is formed between the light-emitting layer 2 and the second planarization layer 6, which is on the same layer as the filter layer 3. The support layer 8 may be made of the same material and process as the lens 4, so as to form the transparent support layer 8. Specifically, a material layer of support layer 8 may be deposited on the filter layer 3 first, then the material of the support layer 8 above the First to third sub-pixels 30 may be removed by a patterning process, and finally the material of the support layer 8 on the fourth sub-pixel 40 may be baked to be hardened to form the support layer 8. It should be understood that the thickness of the support layer 8 is preferably equal to the thickness of the filter layer 3 to facilitate subsequent planarization.

On the basis of including the support layer 8, the second planarization layer 6 is formed on one side of the filter layer 3 and the support layer 8 away from the light-emitting layer 2, covering the filter layer 3 and the support layer 8. Because the height difference between the filter layer 3 and the support. layer 8 is greatly reduced, a better planarization effect can be achieved by the second planarization layer 6.

It should be noted that the support layer 8 may be formed before the filter layer 3, or may be formed after the filter layer 3. If the support layer 8 is formed after the filter layer 3, the material of the support layer 8 is blocked by the filter layer 3 formed around during the baking process, the deformation caused by baking is light, and a complete structure of the support layer 8 can also be formed.

Embodiments of the present disclosure also provide a display device, which includes the display module according to the above-mentioned embodiments. Since the display, device includes the above-mentioned display module, it has the same beneficial effects, which will not be repeated herein.

This disclosure does not specifically limit the application of display devices, which may be TVs, notebook computers, tablet computers, wearable display devices, mobile phones, in-vehicle displays, navigation devices, e-books, digital photo frames, advertising light frames and any other products or parts provided with flexible display function.

Other embodiments of the present disclosure will readily occur to those skilled in the art upon consideration of the specification and practice of the invention disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the scope and spirit of the disclosure being indicated by the appended claims.

What is claimed is:

1. A display panel, comprising a plurality of first pixel units, wherein each of the first pixel units comprises a first sub-pixel, a second sub-pixel, a third sub-pixel and a fourth sub-pixel of different colors, and the four sub-pixels comprise a white sub-pixel;

in each of the first pixel units, the four sub-pixels are arranged in two rows and two columns, the first sub-pixel and the fourth sub-pixel are diagonally located and centrally symmetric, the second sub-pixel and the third sub-pixel are diagonally located and centrally symmetric, the first pixel unit composed of the four sub-pixels is formed in a hexagon as a whole, and the first pixel unit has at least two obtuse angles or two arc edges protruding toward a direction away from a center of the first pixel unit;

wherein the first sub-pixel is a red sub-pixel, the second sub-pixel is a green sub-pixel, the third sub-pixel is a blue sub-pixel, and the fourth sub-pixel is a white sub-pixel;

wherein the display panel further comprises:

a microlens layer comprising a plurality of lenses, wherein each of the lenses is provided corresponding to one of the first pixel units, and is used for converging outgoing light of the sub-pixels; and each of the lenses is provided corresponding to the first sub-pixel, the second sub-pixel, the third sub-pixel and the fourth sub-pixel.

2. The display panel according to claim 1, wherein all sub-pixels in the plurality of first pixel units are arranged in an array along a row direction and a column direction; wherein, in (2m−1)-th row of sub-pixels, the first sub-pixels and the second sub-pixels are alternately arranged; in 2m-th row of sub-pixels, the third sub-pixels and the fourth sub-pixels are alternately arranged; in the (2m−1)-th row and 2m-th row of sub-pixels, the third sub-pixels and the first sub-pixels are located in a same column, and the fourth sub-pixels and the second sub-pixels are located in a same column, where m is a positive integer greater than or equal to 1; and one of the first pixel units is composed of one of the first sub-pixels and one of the second sub-pixels located in the (2m−1)-th row and one of the third sub-pixels and one of the fourth sub-pixels located in the 2m-th row.

3. The display panel according to claim 2, wherein the first sub-pixel, the second sub-pixel, the third sub-pixel and the fourth sub-pixel are all right-angled trapezoids having a same shape and a same size, and the right-angled trapezoid has two right angles, one acute angle and one obtuse angle;

in the first pixel unit, one right angle of each sub-pixel is located in a center of the hexagon and is in contact with each other, the acute angles of two sub-pixels are in contact to form one angle of the hexagon, the acute angles of other two sub-pixels are in contact to form another angle of the hexagon, and the obtuse angles of the four sub-pixels form remaining four angles of the hexagon respectively.

4. The display panel according to claim 3, wherein a first sub-pixel in the (2m−1)-th row and a third sub-pixel in (2m+1)-th row are located in a same column, a second sub-pixel in the (2m−1)-th row and a fourth sub-pixel in the (2m+1)-th row are located in a same column; a third sub-pixel and a fourth sub-pixel in the 2m-th row and a first sub-pixel and a second sub-pixel in the (2m+1)-th row form a second pixel unit, and a shape of the second pixel unit is a rectangle;

in the second pixel unit, the acute angles of two sub-pixels and the obtuse angles of other two sub-pixels are located in a center of the rectangle and are in contact with each other, and the right angles of four sub-pixels are located at outer periphery and separated from each other, forming four angles of the rectangular respectively.

5. The display panel according to claim 4, wherein, in the first pixel unit, an acute angle of the first sub-pixel and an acute angle of the second sub-pixel are in contact to form one angle of the hexagon, an acute angle of the third sub-pixel and an acute angle of the fourth sub-pixel are in contact to form another angle of the hexagon, and the obtuse angles of the four sub-pixels form remaining four angles of the hexagon respectively.

6. The display panel according to claim 5, wherein the acute angle of the right-angled trapezoid is 60°, and the obtuse angle is 120°.

7. The display panel according to claim 6, wherein the hexagon is a regular hexagon, and the rectangle is a square.

8. The display panel according to claim 1, wherein the display panel further comprises:

a driving backplane;

a light-emitting layer provided on one side of the driving backplane, comprising a white light-emitting layer corresponding to each sub-pixel;

a filter layer provided on one side of the light-emitting layer away from the driving backplane, comprising a first filter layer corresponding to the first sub-pixel, a second filter layer corresponding to the second sub-pixel, a third filter layer corresponding to the third sub-pixel, so that the first sub-pixel displays a first color, the second sub-pixel displays a second color, the third sub-pixel displays a third color, and the fourth sub-pixel displays white; and a first planarization layer, provided on one side of the filter layer away from the driving backplane;

wherein the microlens layer is located between the filter layer and the first planarization layer; the lens is a convex lens, and a refractive index of the convex lens is greater than a refractive index of the first planarization layer; or the lens is a concave lens, and a refractive index of the concave lens is smaller than a refractive index of the first planarization layer.

9. The display panel according to claim 8, wherein the display panel further comprises:

a second planarization layer, provided between the microlens layer and the filter layer;

wherein a refractive index of the lens is greater than a refractive index of the second planarization layer.

10. The display panel according to claim 9, wherein the display panel further comprises:

a support layer, provided between the second planarization layer and the light-emitting layer of the fourth sub-pixel, wherein the support layer is a transparent film layer.

11. The display panel according to claim 10, wherein a thickness of the support layer is equal to a thickness of the filter layer.

12. The display panel according to claim 10, wherein a material of the support layer is same as a material of the lens.

13. The display panel according to claim 10, wherein a projection of the lens on the driving backplane is located within a projection of the first pixel unit corresponding to the lens, and is circular.

14. A method for manufacturing a display panel, comprising forming a plurality of first pixel units, wherein each of the first pixel units comprises a first sub-pixel, a second sub-pixel, a third sub-pixel and a fourth sub-pixel of different colors, and the four sub-pixels comprise a white sub-pixel;

wherein, when forming the first pixel units, the four sub-pixels in each of the first pixel units are arranged in two rows and two columns, the first sub-pixel and the fourth sub-pixel are diagonally located and centrally symmetric, the second sub-pixel and the third sub-pixel are diagonally located and centrally symmetric, the first pixel unit composed of the four sub-pixels is formed in a hexagon as a whole, and the first pixel unit has at least two obtuse angles or two arc edges protruding toward a direction away from a center of the first pixel unit;

wherein the first sub-pixel is a red sub-pixel, the second sub-pixel is a green sub-pixel, the third sub-pixel is a blue sub-pixel, and the fourth sub-pixel is a white sub-pixel;

wherein the display panel further comprises:

a microlens layer comprising a plurality of lenses, wherein each of the lenses is provided corresponding to one of the first pixel units, and is used for converging outgoing light of the sub-pixels; and each of the lenses is provided corresponding to the first sub-pixel, the second sub-pixel, the third sub-pixel and the fourth sub-pixel.

15. The method for manufacturing the display panel according to claim 14, wherein forming the first pixel unit comprises:

providing a driving backplane;

forming a light-emitting layer on one side of the driving backplane, wherein the light-emitting layer comprises a white light-emitting layer corresponding to each sub-pixel, forming a filter layer on one side of the light-emitting layer away from the driving backplane, and forming the filter layer comprises forming a first filter layer corresponding to the first sub-pixel, forming a second filter layer corresponding to the second sub-pixel, and forming a third filter layer corresponding to the third sub-pixel;

forming a planarization layer on one side of the filter layer away from the light-emitting layer; and forming a microlens layer on one side of the planarization layer away from the filter layer, wherein the microlens layer comprises a plurality of lenses, each of the lenses is provided corresponding to one of the first pixel units, and is used for converging outgoing light of the sub-pixels.

16. The method for manufacturing the display panel according to claim 15, wherein the method further comprises:

forming a support layer on one side of the light-emitting layer of the fourth sub-pixel away from the driving backplane, wherein the support layer is a transparent film layer;

wherein the planarization layer is formed on one side of the filter layer and the support layer away from the driving backplane.

17. A display device comprising a display panel, wherein the display panel comprises a plurality of first pixel units, each of the first pixel units comprises a first sub-pixel, a second sub-pixel, a third sub-pixel and a fourth sub-pixel of different colors, and the four sub-pixels comprise a white sub-pixel;

in each of the first pixel units, the four sub-pixels are arranged in two rows and two columns, the first sub-pixel and the fourth sub-pixel are diagonally located and centrally symmetric, the second sub-pixel and the third sub-pixel are diagonally located and centrally symmetric, the first pixel unit composed of the four sub-pixels is formed in a hexagon as a whole, and the first pixel unit has at least two obtuse angles or two arc edges protruding toward a direction away from a center of the first pixel unit;

wherein the first sub-pixel is a red sub-pixel, the second sub-pixel is a green sub-pixel, the third sub-pixel is a blue sub-pixel, and the fourth sub-pixel is a white sub-pixel;

wherein the display panel further comprises:

a microlens layer comprising a plurality of lenses, wherein each of the lenses is provided corresponding to one of the first pixel units, and is used for converging outgoing light of the sub-pixels; and each of the lenses is provided corresponding to the first sub-pixel, the second sub-pixel, the third sub-pixel and the fourth sub-pixel.

18. The display device according to claim 17, wherein all sub-pixels in the plurality of first pixel units are arranged in an array along a row direction and a column direction; wherein, in $(2m-1)$-th row of sub-pixels, the first sub-pixels and the second sub-pixels are alternately arranged; in $2m$-th row of sub-pixels, the third sub-pixels and the fourth sub-pixels are alternately arranged; in the $(2m-1)$-th row and $2m$-th row of sub-pixels, the third sub-pixels and the first sub-pixels are located in a same column, and the fourth sub-pixels and the second sub-pixels are located in a same column, where m is a positive integer greater than or equal to 1; and one of the first pixel units is composed of one of the first sub-pixels and one of the second sub-pixels located in the $(2m-1)$-th row and one of the third sub-pixels and one of the fourth sub-pixels located in the $2m$-th row.

* * * * *